(12) United States Patent  
Liu

(10) Patent No.: US 8,410,463 B2  
(45) Date of Patent: Apr. 2, 2013

(54) OPTOCOUPLER DEVICES

(75) Inventor: Yong Liu, Scaraborough, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 686 days.

(21) Appl. No.: 12/617,142

(22) Filed: Nov. 12, 2009

(65) Prior Publication Data

US 2011/0108747 A1    May 12, 2011

(51) Int. Cl.
*G02B 27/00* (2006.01)
*H01L 29/16* (2006.01)

(52) U.S. Cl. ............ 250/551; 250/221; 257/80; 257/81; 257/82

(58) Field of Classification Search .................. 250/551, 250/221; 257/80, 81, 82
See application file for complete search history.

(56) References Cited

U.S. PATENT DOCUMENTS

| 6,806,580 | B2 * | 10/2004 | Joshi et al. | 257/777 |
| 7,589,338 | B2 * | 9/2009 | Liu et al. | 250/551 |
| 8,039,848 | B2 * | 10/2011 | Loh et al. | 257/81 |
| 2009/0140179 | A1 * | 6/2009 | Liu et al. | 250/551 |

* cited by examiner

*Primary Examiner* — Tony Ko
(74) *Attorney, Agent, or Firm* — Kenneth E. Horton; Kirton McConkie

(57) ABSTRACT

Optocoupler devices and methods for making and using such devices are described. The optocoupler devices contain a light emitting component (a light emitting diode [LED]) and a light receiving component (a phototransistor [PT]) device that are embedded within the substrate, rather than being attached to the surface of the pre-molded substrate. Such a configuration eliminates the bond wires that are often used when the LED and PT are attached on the substrate, improves the electrical performance, and allows the final optocoupler package to be made smaller and thinner. Other embodiments are described.

20 Claims, 6 Drawing Sheets

OPTOCOUPLER DEVICES

FIELD

This application relates generally to optocoupler devices and methods for making and using such devices. More specifically, this application describes optocoupler devices where the light emitting element or component and the light receiving element or component are embedded in the substrate of the optocoupler device.

BACKGROUND

Optocoupler devices (or optcouplers) contain at least one optical emitter device (or component) which is optically coupled to an optical receiver device (or component) through an optically transmissive medium. This arrangement permits the passage of information from one electrical circuit that contains the optical emitter device to another electrical circuit that contains the optical receiver device. A high degree of electrical isolation is maintained between the two circuits. Because information is passed optically across an insulating gap, the transfer is one way. For example, the optical receiver device cannot modify the operation of a circuit containing the optical emitter device. This feature is desirable because, for example, the emitter may be driven by a low voltage circuit using a microprocessor or logic gates, while the output optical receiver device may be part of a high voltage DC or AC load circuit. The optical isolation also prevents damage to the input circuit caused by the relatively hostile output circuit.

FIG. 1 shows a side view of a conventional optocoupler package 10. The illustrated optocoupler 10 includes a substrate 24, and solder balls 18 on the substrate 24. An LED (light emitting diode) device 16 including an optical emitter surface 16(a) and a phototransistor device 12 (including an optical receiver surface 12(a)) are on the substrate 24 and are covered by an optically transmissive medium 22.

The output current generated by phototransistor (diode) device 12 is low (e.g., about several nA, the same level as noise) due to the low efficiency of the phototransistor 12 device to receive very limit light emitting by LED. This requires the optocoupler package to have very good electrical performance. However, due to the layout of conventional optocoupler package and its bond wires, the noise of the conventional design can induce a noise level which has the same or even greater than the output current. In addition, the size of conventional optocoupler packages can be hard to reduce due to the bond wire and pre-molded structures. This can limit its application to new generation of electronic products which require an ultra-thin and small size.

SUMMARY

This application describes optocoupler devices and methods for making and using such devices. The optocoupler devices contain a light emitting component (a light emitting diode [LED]) and a light receiving component (a phototransistor [PT]) device that are embedded within the substrate, rather than being attached to the surface of the pre-molded substrate. Such a configuration eliminates the bond wires that are often used when the LED and PT are attached on the substrate, improves the electrical performance, and allows the final optocoupler package to be made smaller and thinner.

BRIEF DESCRIPTION OF THE DRAWINGS

The following description can be better understood in light of the Figures, in which.

Figure 1:
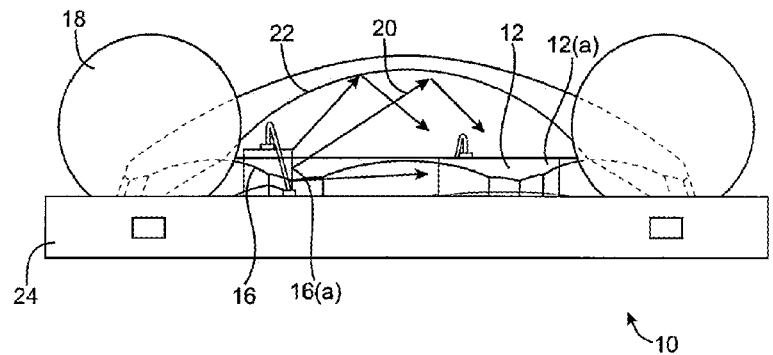
FIG. 1 shows a conventional optocoupler device.

The Figures illustrate specific aspects of the optocoupler devices and methods for making such devices. Together with the following description, the Figures demonstrate and explain the principles of the methods and structures produced through these methods. In the drawings, the thickness of layers and regions are exaggerated for clarity. It will also be understood that when a layer, component, or substrate is referred to as being "on" another layer, component, or substrate, it can be directly on the other layer, component, or substrate, or intervening layers may also be present. The same reference numerals in different drawings represent the same element, and thus their descriptions will not be repeated.

DETAILED DESCRIPTION

The following description supplies specific details in order to provide a thorough understanding. Nevertheless, the skilled artisan would understand that the optocoupler devices and associated methods of making and using the devices can be implemented and used without employing these specific details. Indeed, the optocoupler devices and associated methods can be placed into practice by modifying the illustrated devices and methods and can be used in conjunction with any other apparatus and techniques conventionally used in the industry. For example, while description refers to optocoupler devices, it could be modified for other electronic devices, such as analog IC die or a MOSFET device. As well, while the following description focuses on optocouplers with standard microcoupler ball grid array (BGA) package or a fully molded package with a BGA type of foot print package, it could be modified to also be used as a standard surface mount type land grid array (LGA) device (without solder balls).

Figure 2:
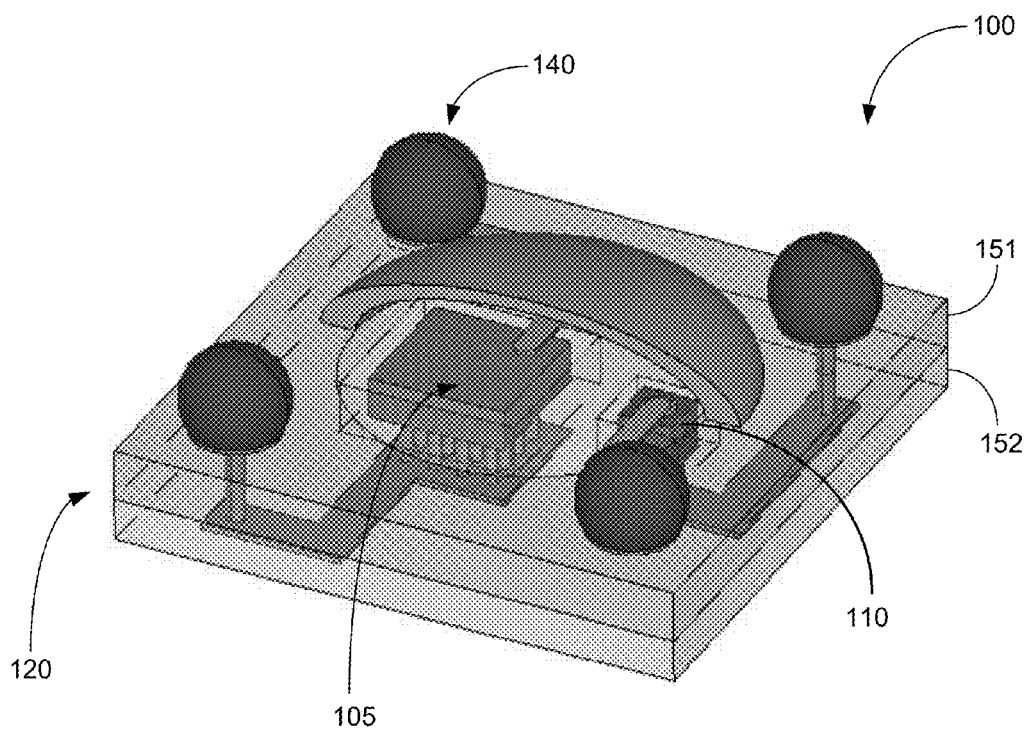
FIG. 2 depicts a cut-away view of some embodiments of an optocoupler package.
Figure 6:
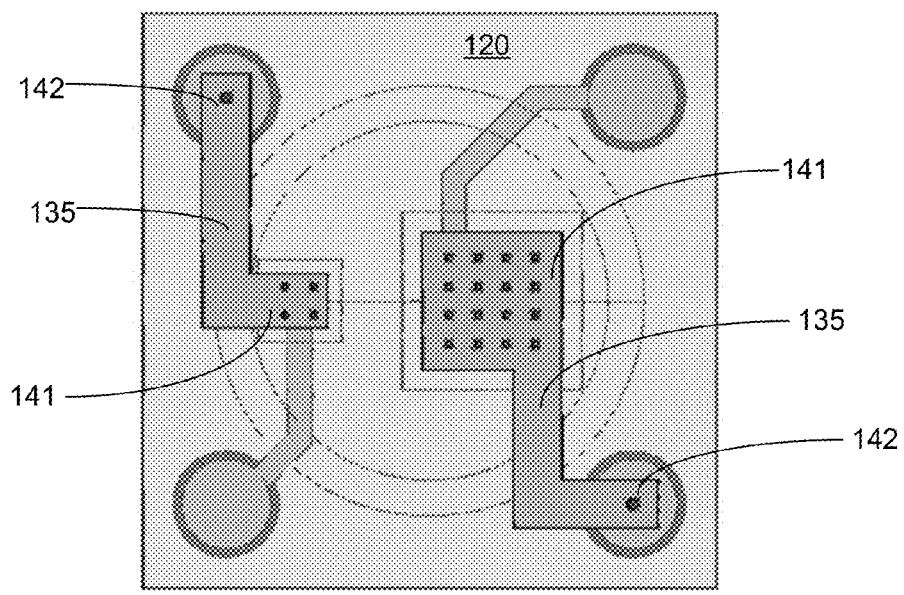
FIG. 6 shows a bottom view of some embodiments of an optocoupler package.

Some embodiments of the optocoupler packages (optocoupler devices formed in a packaging) and methods for making such devices are shown in FIGS. 2-16. In some embodiments, the optocoupler devices 100 contain an optical receiving component (such as a photodetector or phototransistor (or PT) 105) and an optical emitting component (such as a LED 110) embedded within a substrate 120. As shown in FIGS. 2 and 4, the optocoupler devices 100 also contain solder balls 140 that are located on an upper surface of the substrate 120. The substrate 120 partially encloses an upper metal trace structure 125 and a lower metal trace structure 135 (as shown in FIG. 6). The metal trace thickness can range from about 10 μm to about 50 μm. The substrate can comprise a first portion 151 and a second portion 152, both of which can be formed of a resin material and/or a prepreg material.

The solder balls 140 are attached to peripheral regions (e.g., corner regions) of the optocoupler device 100. In some embodiments, the solder balls 140 can have a radius on the order of about 0.5 mm or less. In other embodiment, the solder balls can have a radius of about 0.20 mm. The solder balls 140 may act as input/output terminals for the optical emitter component (PT 105) and the optical receiving component (LED 110). While many of the embodiments described and depicted use solder balls, it is understood that the solder balls could be replaced by other suitable conductive structures including conductive columns (e.g., electroplated columns such as electroplated copper columns).

Figure 3:
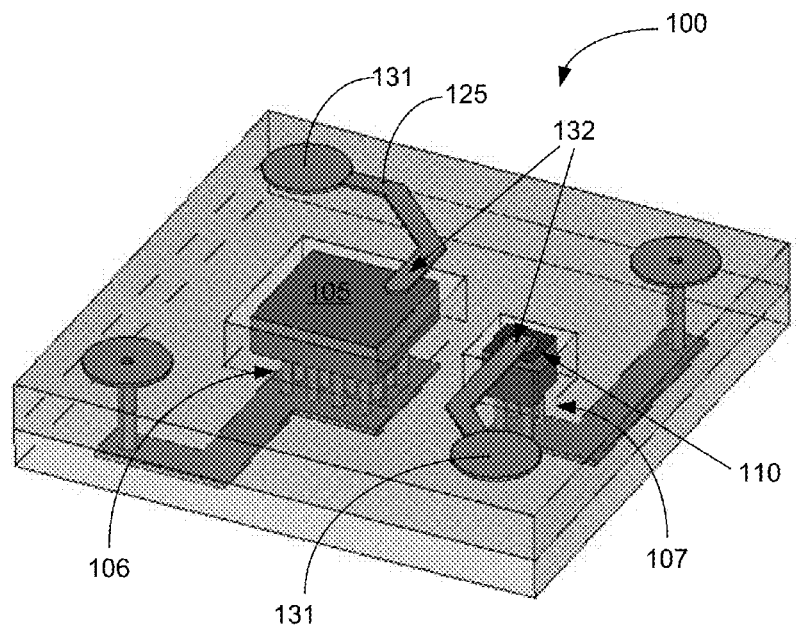
FIG. 3 shows a cut-away view of some embodiments of an optocoupler package.
Figure 4:
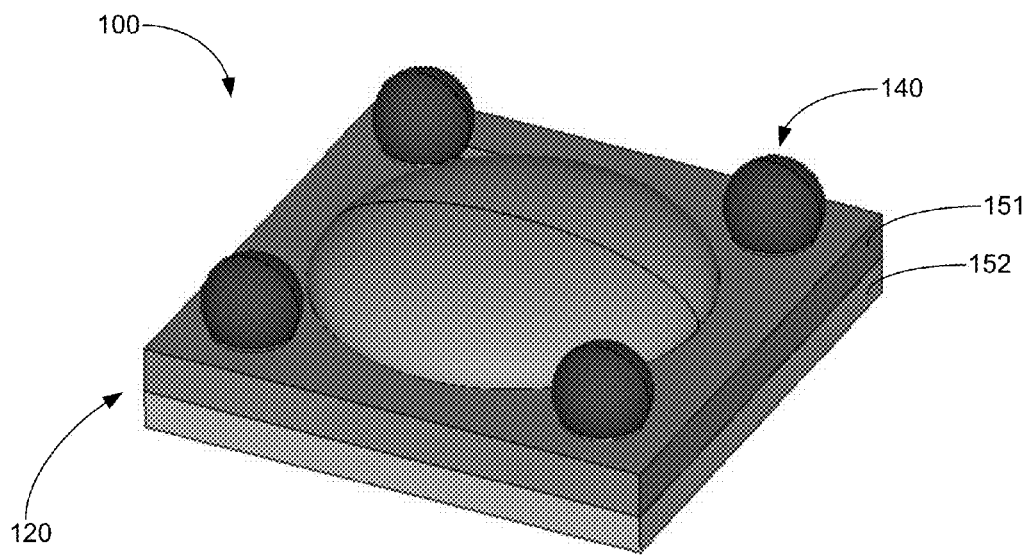
FIG. 4 depicts some embodiments of an optocoupler package.
Figure 5:
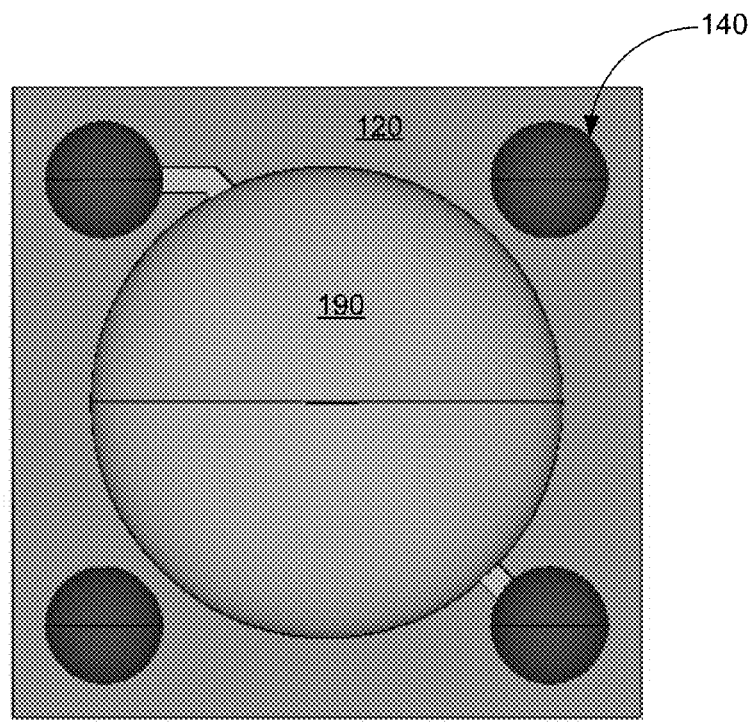
FIG. 5 shows a top view of some embodiments of an optocoupler package.

As shown in FIG. 3, the upper metal trace structure 125 contains a number of exposed regions that are exposed through the upper surface of the substrate 120. The metal trace structure 125 contains one end 131 that is exposed and can be electrically connected to the solder balls 140. The other end 132 of the metal trace 125 can be connected to the PT 105 or the LED 110.

As shown in FIG. 6, the lower metal trace structure 135 also contains a number of exposed regions that are exposed through the bottom surface of the substrate. The metal trace structure 135 contains one end (terminals) 141 that is exposed and can be available for an electrical connection to an external device, such as a printed circuit board (PCB) through the via and the solder ball on other side. The other end 142 of the metal trace structure 135 can be connected to the connectors 106 of the PT 105 or the connectors 107 of LED 110. With such a configuration of the upper and lower metal trace structures, no wire bonds are needed in the optocoupler device 100.

The optocoupler device 100 comprises an optical emitting component (LED 110) that sandwiched between and connected to both of the metal trace structures. The optical emitting component can be any light emitting device known in the art. In some embodiments, the LED 100 can have a cubical shape with a size of about 0.23 mm by about 0.23 mm by about 0.218 mm.

As well, the optocoupler device 100 comprises an optical receiving component (PT 105) that is also sandwiched between and connected to both of the metal trace structures. The optical receiving component can be any photodector device known in the art. In some embodiments, the PT 105 can have a cubical shape having a size of about 0.58 mm by about 0.58 mm by about 0.175 mm.

The optocoupler device 100 also contains a dome structure (or dome) 190. In some embodiments, the dome 190 is made of a partially or completely optically transparent material so that light of the operating wavelength can pass partially or completely though it. The dome can be made of any material consistent with these functions, such as silicone, glass, a transparent epoxy resin, or combinations of these materials. In some embodiments, the material used for the dome 190 comprises an optical coupling gel. This material may be formed over LED 110 as well as the PT 105. In some configurations, the transparent material may be coated with a reflective material (such as silver paint) or an opaque material (such as an epoxy glob) so that any light emitted from the optical emitting component is reflected towards the optical receiving component.

With such a configuration, the size of the optocoupler device 100 can be smaller and thickness can be thinner than conventional optocoupler devices where the PT and the LED are attached on the top surface of the substrate. In some embodiments, the size of the optocoupler device 100 can range from about 2 to about 2.2 mm in length, from about 2 to about 2.2 mm in width, and from about 0.7 to about 0.8 mm in height (thickness). Compared to other optocouplers with a size of about 3.3 by 3.3×1.3 mm as shown in FIG. 1, the optocoupler devices 100 have a reduced size of about 55% and a reduced thickness of about 46%.

The optocoupler devices 100 can be formed using any methods that provide the structures described above. In some embodiments, the methods for making the optocoupler devices 100 begin by providing a carrier 210. The carrier 210 can be any substrate (or film on an underlying substrate) that provides the needed support for the components during the manufacturing process, yet which can be easily removed from the components. In some embodiments, the carrier can comprise any plastic film or tape.

Figure 7:
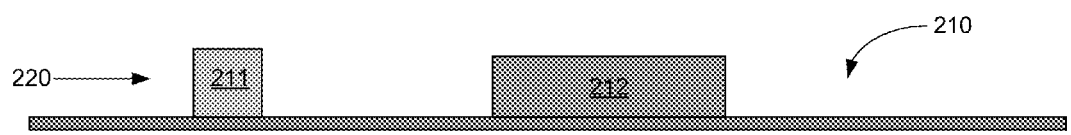
FIG. 7 shows some embodiments for methods of making an optocoupler package with both an opto-emitting die and an opto-receiving die deposited on a carrier.

The method continues when a die (or dies) are attached to the carrier 210. The die(s) can be attached using any process known in the art, including any known die attach process. In some embodiments, the die(s) can be attached to the carrier by equipment using a pick and place process. The die(s) contain the optical emitting and receiving components, whether in separate dies or in the same die. As depicted in FIG. 7, the die(s) can comprise a first die 211 that contains the LED and a second die 212 that contains the PT.

Figure 8:
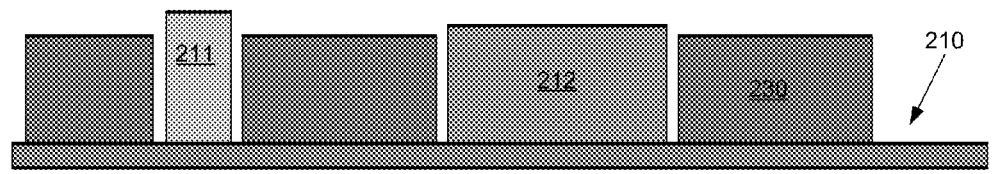
FIG. 8 shows some embodiments for methods of making an optocoupler package with a prepreg material.

A prepreg layer 230 can then be attached to the carrier 210, as shown in FIG. 8. The prepreg layer 230 can comprise any prepreg material known in the art that contains an uncured resin and short fibers and has a thickness of about 0.2 mm to about 0.3 mm. In some embodiments, the prepreg material can include any optically translucent material. The prepreg layer 230 can be formed in those locations on the carrier 210 where the dies 211, 212 are not located.

Figure 9:
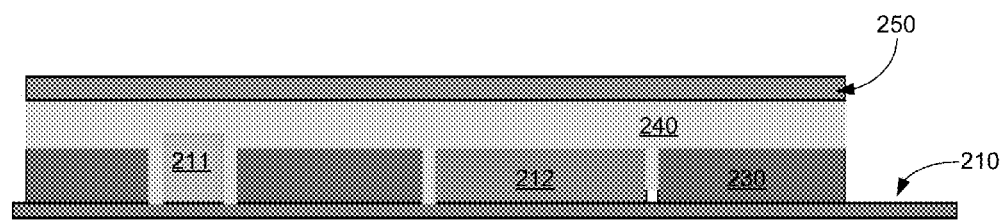
FIG. 9 shows some embodiments for methods of making an optocoupler package with a resin material and a conductive layer.

Next, as shown in FIG. 9, a conductive layer 250 coated with resin material 240 can then be provided on the die and the prepreg. The resin material 240 (which can have a thickness of about 0.05 mm to about 0.1 mm) can then be used to fill the empty spaces on the carrier 210 left between the dies and the prepreg layer 230 at the curing temperature of prepreg. The resin material can be any epoxy resin material in the art. The conductive layer 250 can comprises any conductive material known in the art, including any metal or non-metal conductive materials. The resin 240 coated with conductive layer 250 such as copper is called resin coated copper (RCC) foil. The conductive layer 250 can have a thickness is of about 10 μm to about 50 μm. The conductive layer 250 with resin 240 can be deposited using any process known in the art until the desired thickness is reached. Then, a lamination process (such as a vacuum lamination process) can be used to temporarily seal the various components together into the structure illustrate in FIG. 9.

Figure 10:
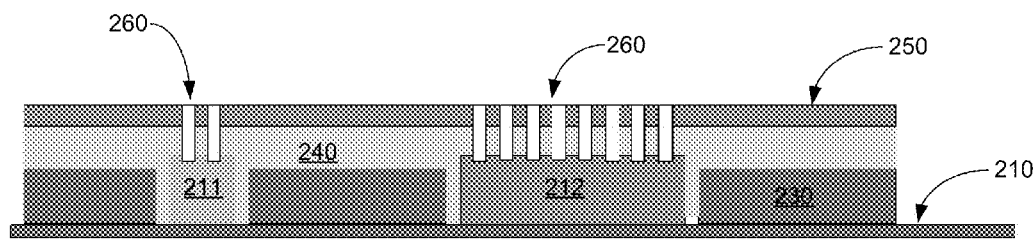
FIG. 10 shows some embodiments for methods of making an optocoupler package with vias formed through the resin material and the conductive layer to the die surfaces.

Selected portions of the conductive layer 250 and resin material 240 can then be removed. In some embodiments, these materials are removed using any known laser drilling process to form holes (or vias) 260 as shown in FIG. 10. This process removes those portions of the conductive layer 250 and resin material 240 where the connectors 106, 107 of the PT and the LED will be formed as a connection to the metal trace structure 135.

Figure 11:
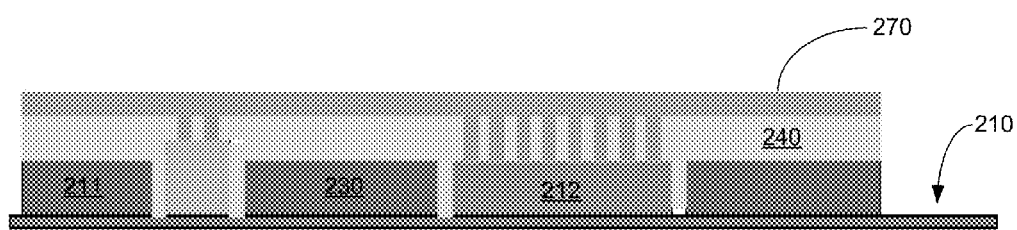
FIG. 11 shows some embodiments for methods of making an optocoupler package with an electroplated layer.

Next, an electroplating process can be performed to manufacture part of the metal trace structure 135 on the lower (or back side) part of the optocoupler device 100. The electroplating process uses substantially the same conductive material that will be used to form the metal trace structure 135. The electroplating process fills in the holes 260 that were formed in the laser drilling process and also forms an electroplated layer 270 on the surface of the conductive layer 250. In some embodiments, as depicted in FIG. 11, the electroplated layer 270 and the conductive layer 250 can form a single conductive layer.

Figure 12:
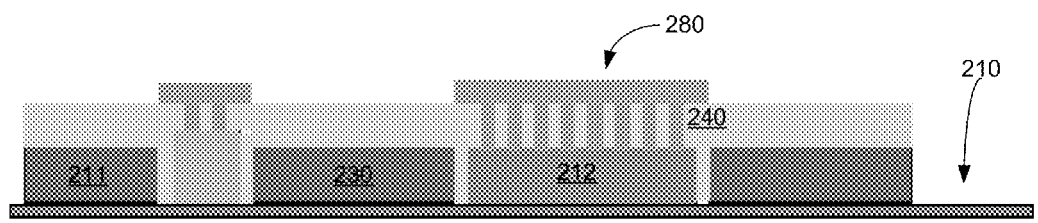
FIG. 12 shows some embodiments for methods of making an optocoupler package with the electroplated layer patterned and etched.

Then, the electroplated layer 270 can be patterned to form the metal trace structure 135 on the back side of the optocoupler device 100. The electroplated layer 270 can be patterned using any process known in the art, including a photolithographic patterning and etching process. The resulting patterned layer 280 (which forms part of the metal trace structure 135) is illustrated in FIG. 12.

Figure 13:
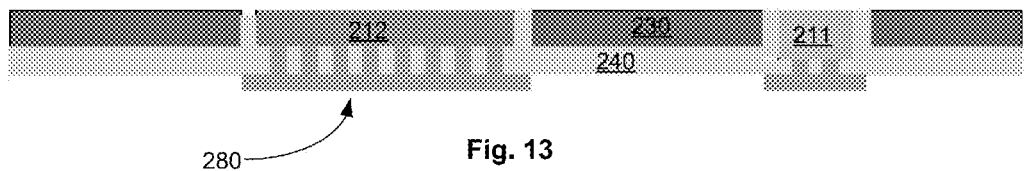
FIG. 13 shows some embodiments for methods of making an optocoupler package with the carrier removed.

The structure is then flipped over and the carrier 210 is then removed from the back side. The carrier 210 can be removed using any removal process known in the art, including just removing by any peeling process. With the carrier 210 removed, the top surface of the die 211 containing the LED and the die 212 containing the PT is exposed, as shown in FIG. 13.

Figure 14:
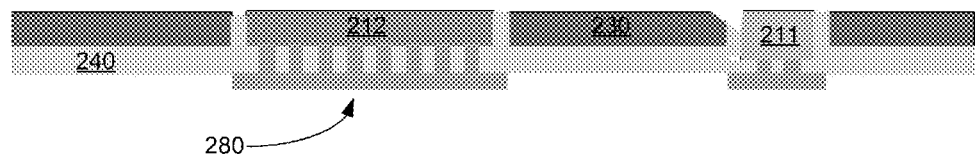
FIG. 14 shows some embodiments for methods of making an optocoupler package with an etch performed near the upper sides of the die.

An optionally etching process can then be performed to remove part of the prepreg material and the resin material that is adjacent the top side of the die 211 containing the LED 110 and the die 212 containing the PT 105. Any known etching process can be used in this removal process. The resulting structure is illustrated in FIG. 14, where the top and upper sides of the LED and the PT are exposed and can therefore emit and receive light.

Figure 15:
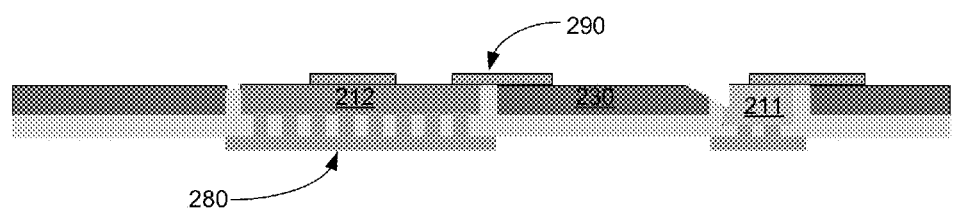
FIG. 15 shows some embodiments for methods of making an optocoupler package with a patterned plating layer formed.
Figure 16:
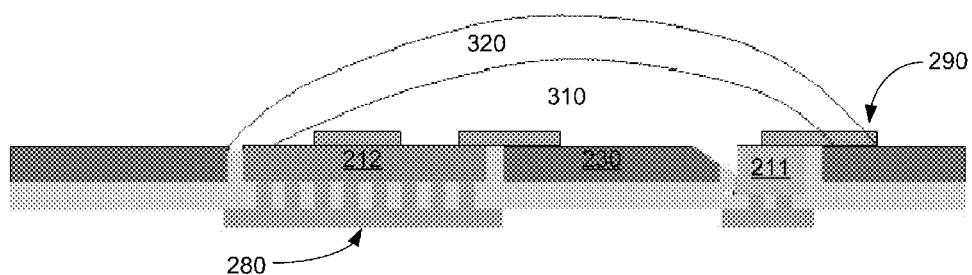
FIG. 16 shows some embodiments of methods for making an optocoupler package with a dome structure.

Then, a conductor layer 290 can be deposited and patterned to form the upper metal trace structure 125 on the upper side of the optocoupler package 100. The conductive layer 290 can be deposited using any known process, such as a metal deposition process. The conductive layer can then be patterned using any process known in the art, including a photolithographic patterning and etching process. The resulting patterned layer (which forms part of the metal trace structure 125) is illustrated in FIG. 15.

Then, the dome structure 190 can be formed using any known process. In some embodiments, the dome 190 is formed by depositing a gel layer 310 over an inner portion of the optocoupler device using any process known in the art. Then, an epoxy layer 320 can be formed over the top of the gel layer 310. The resulting structure is depicted in the side view illustrated in FIG. 16. After that, solder balls can be bumped on the pads of the substrate as known in the art. The resulting device can then be singulated by any known process, such as by a saw singulation process to form the BGA optocoupler device. In other embodiments, solder balls are not used and the device is singulated to form a LGA optocoupler device.

In some embodiments, a method for making a optocoupler device comprises providing a light emitting component; providing a light receiving component; providing a substrate enclosing the light emitting component and the light receiving component except for an upper surface and a portion of a side surface thereof; providing solder balls located on an upper surface of the substrate; providing terminals located on a bottom surface of the substrate; providing an upper metal trace structure connecting the light emitting and light receiving components with the solder balls; and providing a lower metal trace structure connecting the light emitting and light receiving components with the terminals.

In addition to any previously indicated modification, numerous other variations and alternative arrangements may be devised by those skilled in the art without departing from the spirit and scope of this description, and appended claims are intended to cover such modifications and arrangements. Thus, while the information has been described above with particularity and detail in connection with what is presently deemed to be the most practical and preferred aspects, it will be apparent to those of ordinary skill in the art that numerous modifications, including, but not limited to, form, function, manner of operation and use may be made without departing from the principles and concepts set forth herein. Also, as used herein, examples are meant to be illustrative only and should not be construed to be limiting in any manner.

The invention claimed is:

1. An optocoupler package, comprising:
a light emitting component;
a light receiving component;
a substrate enclosing the light emitting component and the light receiving component except for an upper surface and a portion of a side surface thereof;
solder balls located on an upper surface of the substrate;
terminals located on a bottom surface of the substrate;
an upper metal trace structure connecting the light emitting and light receiving components with the solder balls; and
a lower metal trace structure connecting the light emitting and light receiving components with the terminals.

2. The optocoupler package of claim 1, wherein the light emitting component comprises a light emitting diode.

3. The optocoupler package of claim 1, wherein the light receiving component comprises a phototransistor.

4. The optocoupler package of claim 1, wherein the substrate comprises a resin material.

5. The optocoupler package of claim 4, wherein the substrate comprises a prepreg material.

6. The optocoupler package of claim 1, wherein the light emitting component and light receiving component are contained in separate dies.

7. The optocoupler package of claim 1, further comprising a partially or completely optically transparent material covering the light emitting component and the light receiving component.

8. The optocoupler package of claim 7, further comprising an optically reflective material overlying the optically transparent material.

9. The optocoupler package of claim 1, wherein the package has a size less than about 2.2 mm by about 2.2 mm and a thickness less than about 0.8 mm.

10. An electronic device containing an optocoupler package, the package comprising:
a light emitting component;
a light receiving component;
a substrate enclosing the light emitting component and the light receiving component except for an upper surface and a portion of a side surface thereof;
solder balls located on an upper surface of the substrate;
terminals located on a bottom surface of the substrate;
an upper metal trace structure connecting the light emitting and light receiving components with the solder balls; and a lower metal trace structure connecting the light emitting and light receiving components with the terminals.

11. The device of claim 10, wherein the light emitting component comprises a light emitting diode.

12. The device of claim 10, wherein the light receiving component comprises a phototransistor.

13. The device of claim 10, wherein the substrate comprises a resin material.

14. The device of claim 13, wherein the substrate comprises a prepreg material.

15. The device of claim 10, wherein the light emitting component and light receiving component are contained in separate dies.

16. The device of claim 10, further comprising a partially or completely optically transparent material covering the light emitting component and the light receiving component.

17. The device of claim 16, further comprising an optically reflective material overlying the optically transparent material.

18. The device of claim 10, wherein the package has a size less than about 2.2 mm by about 2.2 mm and a thickness less than about 0.8 mm.

19. An optocoupler device, comprising:
a light emitting diode contained in a first die;
a phototransistor contained in a second die;
a substrate comprising a resin material and enclosing the light emitting diode and the phototransistor except for an upper surface and a portion of a side surface thereof;
solder balls located on an upper surface of the substrate;
terminals located on a bottom surface of the substrate;
an upper metal trace structure connecting the light emitting diode and phototransistor with the solder balls; and
a lower metal trace structure connecting the light emitting diode and phototransistor with the terminals.

20. The device of claim 19, wherein the device has a size less than about 2.2 mm by about 2.2 mm and a thickness less than about 0.8 mm.

\* \* \* \* \*